(12) United States Patent
Chen et al.

(10) Patent No.: US 10,101,857 B2
(45) Date of Patent: Oct. 16, 2018

(54) METHODS FOR INTEGRATING A COMPLIANT MATERIAL WITH A SUBSTRATE

(71) Applicant: Apple Inc., Cupertino, CA (US)

(72) Inventors: Po-Jui Chen, Taipei (TW); Kuo-Hua Sung, Cupertino, CA (US); Hui Chen, Cupertino, CA (US)

(73) Assignee: Apple Inc., Cupertino, CA (US)

( * ) Notice: Subject to any disclaimer, the term of this patent is extended or adjusted under 35 U.S.C. 154(b) by 256 days.

(21) Appl. No.: 14/838,959

(22) Filed: Aug. 28, 2015

(65) Prior Publication Data
US 2017/0060290 A1     Mar. 2, 2017

(51) Int. Cl.
G06F 3/044    (2006.01)
G06F 3/041    (2006.01)
H05K 3/36     (2006.01)
H03K 17/96    (2006.01)

(52) U.S. Cl.
CPC ............ G06F 3/044 (2013.01); G06F 3/0414 (2013.01); H03K 17/962 (2013.01); H05K 3/361 (2013.01); G06F 2203/04103 (2013.01); H03K 2217/960755 (2013.01); H03K 2217/960765 (2013.01)

(58) Field of Classification Search
CPC ...... G06F 3/0412; G06F 3/0414; G06F 3/044; G06F 2203/04102; G06F 2203/4103; H05K 1/0393; H05K 3/0058; H05K 3/0064; H05K 3/007; H05K 3/28; H05K 3/361; H05K 3/4038; H05K 3/4053; H05K 3/5061; H05K 3/45092; H05K 3/4644; H05K 3/4664; H05K 3/4667; H05K 3/467; B23B 2457/208; G01L 1/142; Y10T 29/49124
See application file for complete search history.

(56) References Cited

U.S. PATENT DOCUMENTS

| | | | |
|---|---|---|---|
| 6,504,530 B1 | 1/2003 | Wilson | |
| 7,152,482 B2 | 12/2006 | Ueno et al. | |
| 8,144,271 B2 | 3/2012 | Han | |
| 8,305,358 B2 | 11/2012 | Klinghult | |
| 8,421,483 B2 | 4/2013 | Klinghult | |
| 8,547,495 B2 | 10/2013 | Lee | |
| 8,553,004 B2 | 10/2013 | Hotelling et al. | |
| 8,560,947 B2 | 10/2013 | Gillespie et al. | |
| 8,618,720 B2 | 12/2013 | Paleczny et al. | |
| 8,730,199 B2 | 5/2014 | Sleeman et al. | |

(Continued)

FOREIGN PATENT DOCUMENTS

WO     WO 15/077200     5/2015

OTHER PUBLICATIONS

Min et al., "Adaptive Touch Sampling for Energy-Efficient Mobile Platforms," Intel Corporation, Hillsboro, or 97124, 4 pages.

(Continued)

*Primary Examiner* — Peter DungBa Vo
*Assistant Examiner* — Joshua D Anderson
(74) *Attorney, Agent, or Firm* — Brownstein Hyatt Farber Schreck, LLP

(57) ABSTRACT

A sensor module can include a sensor that is configured to detect any given input or environmental conditions, such as, for example, touch or force inputs. The sensor module can be included in an electronic device. Methods for producing the sensor module are disclosed.

11 Claims, 16 Drawing Sheets

(56) References Cited

U.S. PATENT DOCUMENTS

| | | | |
|---|---|---|---|
| 8,743,060 B2 | 6/2014 | Hotelling | |
| 8,878,811 B1 | 11/2014 | Baumbach | |
| 8,970,507 B2 | 3/2015 | Holbein et al. | |
| 8,988,384 B2 | 3/2015 | Krah et al. | |
| 9,081,453 B2 | 7/2015 | Bulea et al. | |
| 9,116,570 B2 | 8/2015 | Lee et al. | |
| 9,348,472 B2 | 5/2016 | Kang | |
| 9,690,408 B1 | 6/2017 | Krah | |
| 9,779,676 B2 | 10/2017 | Al-Dahle et al. | |
| 9,874,965 B2 | 1/2018 | Pedder | |
| 2007/0119698 A1 | 5/2007 | Day | |
| 2009/0002199 A1 | 1/2009 | Lainonen et al. | |
| 2009/0151475 A1 | 6/2009 | Masaki | |
| 2009/0165564 A1 | 7/2009 | Matsushima | |
| 2009/0273570 A1* | 11/2009 | Degner | G06F 3/044 345/173 |
| 2009/0326833 A1 | 12/2009 | Ryhanen et al. | |
| 2010/0162562 A1* | 7/2010 | Lee | H05K 3/429 29/852 |
| 2012/0086666 A1 | 4/2012 | Badaye et al. | |
| 2012/0318070 A1 | 12/2012 | Evans | |
| 2013/0082970 A1 | 4/2013 | Frey et al. | |
| 2013/0096849 A1 | 4/2013 | Campbell et al. | |
| 2013/0256002 A1* | 10/2013 | Ozeki | C08G 69/48 174/251 |
| 2014/0098028 A1 | 4/2014 | Kwak et al. | |
| 2014/0204285 A1 | 7/2014 | Jang | |
| 2014/0320438 A1 | 10/2014 | Yurlov et al. | |
| 2015/0084909 A1 | 3/2015 | Worfolk et al. | |
| 2015/0103038 A1 | 4/2015 | Han et al. | |
| 2015/0339001 A1 | 11/2015 | Zirkl et al. | |
| 2016/0062497 A1 | 3/2016 | Huppi et al. | |
| 2016/0378223 A1* | 12/2016 | Hyuga | G06F 3/044 345/174 |
| 2017/0060292 A1 | 3/2017 | Chen et al. | |
| 2017/0131840 A1 | 5/2017 | Deichmann et al. | |
| 2017/0285799 A1 | 10/2017 | Iuchi et al. | |
| 2017/0285810 A1 | 10/2017 | Krah | |
| 2017/0336902 A1 | 11/2017 | Smith | |
| 2018/0025694 A1 | 1/2018 | Al-Dahle et al. | |

OTHER PUBLICATIONS

Bau, et al., "TeslaTouch: Electrovibration for Touch Surfaces," UIST'10, Oct. 3-6, 2010, New York, New York USA, 10 pages.

Feist, "Samsung snags patent for new pressure sensitive touchscreens," posted on AndroidAuthority.com at URL: http://www.androidauthority.com/samsung-patent-pressure-sensitive-touchscreens-354860, Mar. 7, 2014, 1 page.

* cited by examiner

METHODS FOR INTEGRATING A COMPLIANT MATERIAL WITH A SUBSTRATE

FIELD

The described embodiments relate generally to electronic devices. More particularly, the present embodiments relate to methods for integrating a compliant material with at least one substrate.

BACKGROUND

Electronic devices include many different electrical, mechanical, and structural components. One example of an electrical component is a sensor, such as a capacitive sensor that can be used to detect a touch or force input applied to a surface of the electronic device. A capacitive sensor typically includes two conductive plates, or electrodes, separated by a gap. In some instances, it is desirable to reduce the thickness or height of the sensor in the z-direction. For example, it can be beneficial to produce a sensor with a reduced height when the sensor is to be positioned in location that has limited space. Additionally or alternatively, the construction of the sensor should permit efficient manufacturing and mass production.

SUMMARY

A sensor module can include a sensor that is configured to detect any given input or environmental condition, such as, for example, touch or force inputs. The sensor module can be included in an electronic device. In one embodiment, the sensor can include a compliant layer positioned between two substrates. Each substrate can include one or more electrical components, such as conductive electrodes. Each conductive electrode of one substrate can be aligned with a respective electrode in the other substrate. Each pair of conductive electrodes forms a capacitor. In one embodiment, the first and second substrates are flexible printed circuits and the compliant material is a liquid silicone. The sensor module can include one or more substrate tails that extend out from the sensor. In one embodiment, the one or more substrate tails can extend into an opening that is surrounded by the sensor. A conductive structure, such as an interposer flexible circuit, is connected to the end of each substrate tail.

The sensor module can be produced using one of several methods. In one embodiment, a method for producing the sensor module includes providing a compliant structure that includes a compliant layer and forming a first substrate layer over a first surface of the compliant structure. A first substrate tail is produced from a portion of the first substrate layer. In one embodiment, the first substrate tail is produced by removing a portion of the compliant structure and at least one layer in the first substrate layer. In some embodiments, a second substrate layer may be positioned over a second surface of the compliant structure, and a second substrate tail can be produced from a portion of the second substrate layer.

In another embodiment, a method for producing the sensor module can include providing a first substrate layer and a second substrate layer, where the first and second substrate layers each include one or more electrical components. The first and second substrate layers are separated from each other by a gap. A spacer element can be positioned in the gap between the first and second substrate layers. The spacer element fills only a portion of the gap between the first and second substrate layers. A compliant material may then be injected into the portion of the gap that does not include the spacer element. The spacer element is then removed to produce a first substrate tail from a portion of the first substrate layer and a second substrate tail from a portion of the second substrate layer.

In another embodiment, a method for producing the sensor module can include providing a first substrate layer that includes one or more electrical components and providing a compliant structure that includes a compliant layer. The first substrate layer is attached to a first surface of the compliant structure, and a first substrate tail is produced from a portion of the first substrate layer. In some embodiments, the method may include providing a second substrate layer that includes one or more electrical components and attaching the second substrate layer to a second surface of the compliant structure. A second substrate tail can then be produced from a portion of the second substrate layer.

BRIEF DESCRIPTION OF THE DRAWINGS

The disclosure will be readily understood by the following detailed description in conjunction with the accompanying drawings, wherein like reference numerals designate like structural elements, and in which.

DETAILED DESCRIPTION

Figure 1:
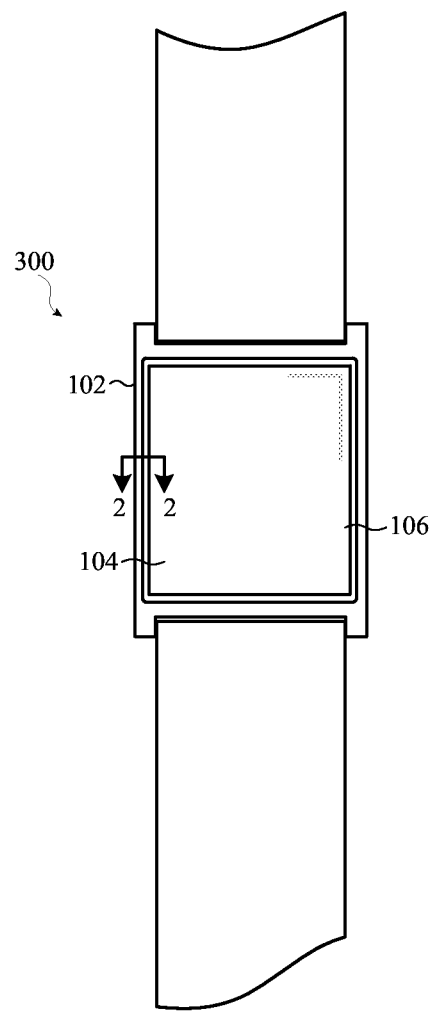
FIG. 1 shows a plan view of one example of an electronic device that can include a sensor.

Reference will now be made in detail to representative embodiments illustrated in the accompanying drawings. It should be understood that the following descriptions are not intended to limit the embodiments to one preferred embodiment. To the contrary, it is intended to cover alternatives, modifications, and equivalents as can be included within the spirit and scope of the described embodiments as defined by the appended claims.

The following disclosure relates to sensor module that includes a sensor configured to detect any given input or environmental condition, such as, for example, touch or force inputs. As one example, the sensor can include a compliant layer positioned between two substrates. Each substrate can include one or more electrical components, such as conductive electrodes. Each conductive electrode of one substrate may be aligned with a respective electrode in the other substrate. Each pair of conductive electrodes forms a capacitor. In one embodiment, the first and second substrates are flexible printed circuits and the compliant material is a liquid silicone.

The sensor module can be included in an electronic device. In a particular embodiment the sensor of the sensor module is positioned around an internal periphery of the electronic device. One or more substrate tails extend out from the sensor into the interior of the electronic device. A conductive structure, such as an interposer flexible circuit, is connected to the end of each substrate tail. The conductive structure is used to connect the sensor to another electrical component in the electronic device. For example, the sensor can be operably connected to a processing device through the substrate tail(s).

The sensor module can be attached to a support structure in the electronic device with one or more adhesive layers. In one embodiment, the support structure can be a ledge that is attached to the enclosure of the electronic device or integrally formed as a part of the enclosure of the electronic device. Various techniques for producing the sensor module are disclosed herein.

These and other embodiments are discussed below with reference to FIGS. 1-15. However, those skilled in the art will readily appreciate that the detailed description given herein with respect to these Figures is for explanatory purposes only and should not be construed as limiting.

Directional terminology, such as "top", "bottom", "front", "back", "leading", "trailing", etc., is used with reference to the orientation of the Figure(s) being described. Because components of embodiments described herein can be positioned in a number of different orientations, the directional terminology is used for purposes of illustration only and is in no way limiting. When used in conjunction with layers of an electronic component (e.g., a sensor), the directional terminology is intended to be construed broadly, and therefore should not be interpreted to preclude the presence of one or more intervening layers or other intervening features or elements. Thus, a given layer that is described as being formed, positioned, disposed on or over another layer, or that is described as being formed, positioned, disposed below or under another layer may be separated from the latter layer by one or more additional layers or elements.

FIG. 1 illustrates a plan view of one example of an electronic device that can include a sensor. The illustrated electronic device 100 is depicted as a wearable electronic device that may provide information regarding time, health, fitness, wellness, messages, video, operating commands, and statuses of externally connected or communicating devices and/or software executing on such devices (and may receive any of the foregoing from an external device). Other embodiments are not limited to a wearable electronic device. For example, an electronic device can be a tablet computing device, a digital music player, a gaming device, a laptop computer, a remote control, a smart telephone, and any other suitable electronic device.

An enclosure 102 can form an outer surface or partial outer surface for the internal components of the electronic device 100. The enclosure 102 at least partially surrounds a display 104 and one or more input/output devices (not shown). The enclosure 102 can be formed of one or more components operably connected together, such as a front piece and a back piece. Alternatively, the enclosure 102 can be formed of a single piece operably connected to the display 104. The enclosure 102 can be formed of any suitable material, including, but not limited to, plastic and metal. In the illustrated embodiment, the enclosure 102 is formed into a substantially rectangular shape, although this configuration is not required.

The display 104 can provide a visual output to the user. The display 104 can be implemented with any suitable technology, including, but not limited to, a multi-touch sensing touchscreen that uses liquid crystal display (LCD) technology, light emitting diode (LED) technology, organic light-emitting display (OLED) technology, organic electroluminescence (OEL) technology, or another type of display technology. In some embodiments, the display 104 can function as an input device that allows the user to interact with the electronic device 100. For example, the display can include a touch sensing device that allows the display to function as a multi-touch display.

In some embodiments, a cover glass 106 can be disposed over a top surface of the display 104 and the electronic device 100. The cover glass can be a transparent cover glass when the cover glass is disposed over the display (or the portion of the cover glass overlying the display may be transparent). The cover glass 106 may be made of any suitable material, such as glass, plastic, or sapphire.

Figure 2:
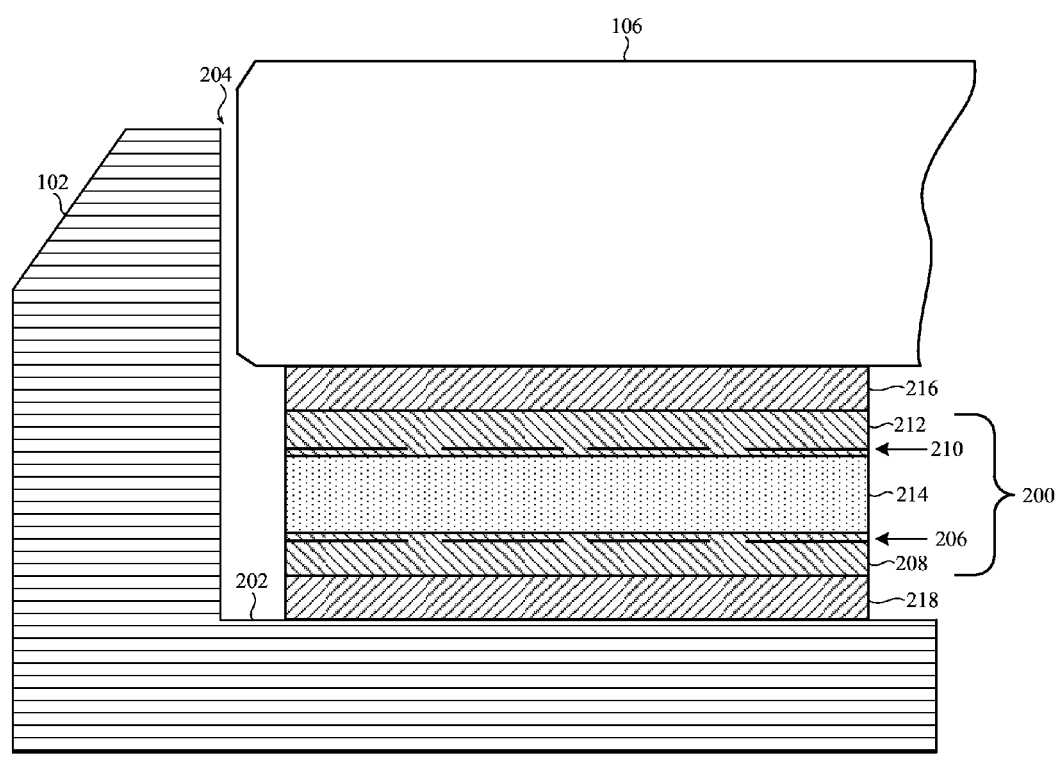
FIG. 2 shows a cross-sectional view of the electronic device taken along line 2-2 in FIG. 1.

In some embodiments, the electronic device can include one or more sensors that is configured to detect any given input or environmental condition. In one embodiment, a sensor is positioned around an internal periphery of the electronic device. For example, a proximity sensor, a motion sensor, a touch sensor, and/or a force sensor may be included in the electronic device. FIG. 2 shows a cross-sectional view of the electronic device taken along line 2-2 in FIG. 1. In the illustrated embodiment, a force sensor 200 is positioned between the enclosure 102 and the cover glass 106. In particular, the force sensor 200 rests on a ledge 202 of the enclosure 102. The ledge 202 extends into the interior of the electronic device. In some embodiments, the ledge 202 can be integrally formed as part of the enclosure 102. Alternatively, in other embodiments the ledge 202 is connected or affixed to the enclosure 102 using any suitable attachment mechanism. For example, the ledge 202 can be affixed to the enclosure 102 using an adhesive, one or more mechanical attachments such as a screw, or by welding the ledge 202 to the enclosure 102.

In the illustrated embodiment, the enclosure includes an opening 204 that corresponds to the shape of the cover glass 106. The cover glass 106 is disposed in the opening 204. As shown in FIG. 2, a top surface of the cover glass 106 can extend beyond the top surface of the enclosure 102. In other embodiments, the top surface of the cover glass 106 may be co-planar with or below the top surface of the enclosure 102. In some embodiments, the force sensor 200 can seal the space or the junction between the top surface of the ledge 202 and the bottom surface of the cover glass 106. In one embodiment, the force sensor 200 is a continuous sensor that extends completely around the internal perimeter of the electronic device 100. In another embodiment, the force sensor 200 can be one or more discrete sensors that are disposed at select locations around the internal periphery of the electronic device 100.

The force sensor 200 can include any suitable circuitry or components that support the operations and functionality of the sensor. In a non-limiting example, a first set of conductive electrodes 206 can be formed over (e.g., included in or on) a surface of a substrate layer 208 and a second set of conductive electrodes 210 can be formed over a surface of a second substrate layer 212. In one non-limiting example, the first and second substrate layers 208, 212 can each be a flexible printed circuit. Those skilled in the art will appreciate that different types of substrate layers can be used in other embodiments.

The first and second sets of conductive electrodes 206, 210 can each include one or more conductive electrodes. Each conductive electrode in the first set of conductive electrodes 206 is aligned and paired with a respective conductive electrode in the second set of conductive electrodes 210. Each pair of conductive electrodes forms a capacitor. The force sensor 200 is configured to produce changes in capacitance based on a force applied to the cover glass 106. The capacitance of one or more capacitors in the force sensor 200 may vary when a user applied a force to the cover glass 106. A processing device (not shown) operably connected to the force sensor 200 can correlate the changes in capacitance to an amount of force (or to changes in force). The user can apply the force to the cover glass 106 with a body part (e.g., a finger) or with a device, such as a stylus.

A compliant layer 214 is disposed between the first and second flexible circuit layers 208, 212. The compliant layer 214 can be formed with any suitable material. As one example, the compliant layer 214 is made of a polymer material, such as silicone, but other embodiments are not limited to this configuration. The compliant layer 214 is configured to provide elastic deformation to the sensor 200 based on a touch and/or a force applied to the cover glass 106. Additionally, in the illustrated embodiment the compliant layer 214 is a dielectric for the one or more capacitors that are formed by the pairs of conductive electrodes in the first and second sets of conductive electrodes 206, 210.

The force sensor 200 is attached to the cover glass 106 and to the enclosure 102 using adhesive layers 216, 218, respectively. The first adhesive layer 216 is positioned between the second substrate layer 212 and the bottom surface of the cover glass 106. The second adhesive layer 218 is positioned between the first substrate layer 208 and the top surface of the ledge 202. Any suitable adhesive material can be used in the adhesive layers 216, 218. In one embodiment, the first and second adhesive layers 216, 218 are pressure sensitive adhesive layers.

In other embodiments, the force sensor (as well as any other suitable sensor) can be constructed with different circuitry and/or components. As one example, a force sensor can be implemented as an optical force sensor, a strain gauge, or an ultrasonic force sensor.

Figure 3:
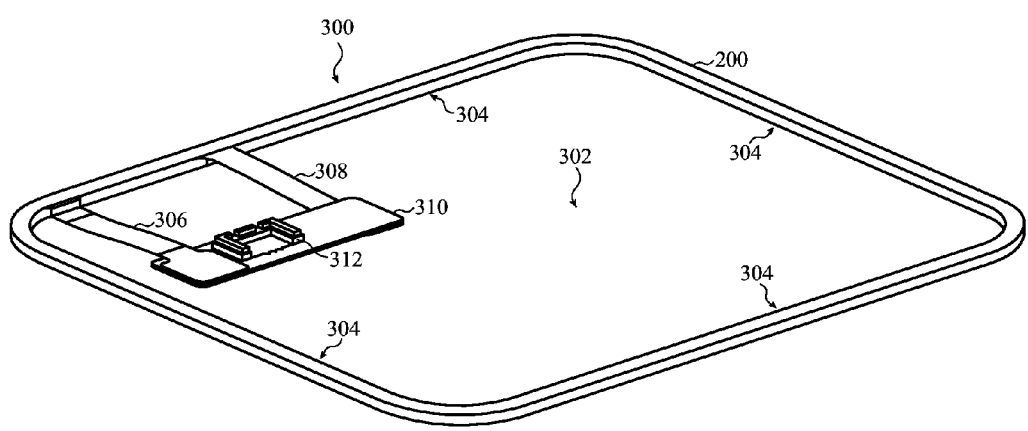
FIG. 3 shows one example of a sensor module.

FIG. 3 shows one example of a sensor module. The sensor module 300 includes the sensor 200 configured a continuous force sensor that extends completely around the internal periphery of the electronic device 100. An opening 302 is formed in between the inside edges 304 of the sensor 200. The first substrate layer 208 (not shown) and the second substrate layer 212 (not shown) extend away from an inside edge 304 of the sensor 200 and into the opening 302 to form first and second substrate tails 306, 308, respectively. When the first and second substrate layers 208, 210 are flexible printed circuits, the first and second substrate tails 306, 308 are flexible circuit tails. The ends of the first and second substrate tails 306, 308 connect to an interposer flexible circuit 310. Although not limited to this construction, the first substrate tail 306 can connect to a top surface of the interposer flexible circuit 310 and the second substrate tail 308 may connect to a bottom surface of the interposer flexible circuit 310. A connector 312, such as a board-to-board connector is connected to the interposer flexible circuit 310.

In one embodiment, the second substrate tail 308 is used as a drive tail that is configured to transmit drive signals to the first set of conductive electrodes 206. The first substrate tail 306 is used to as a sense tail that is configured to receive sense signals from the second set of conductive electrodes 210. The connector 312 electrically connects the sensor 200 (through first and second substrate tails 306, 308) to another circuit or component in the electronic device, such as a processing device (not shown). The processing device is configured to receive the sense signals and correlate the changes in capacitance (represented by the sense signals) to an amount of force.

Figure 4:
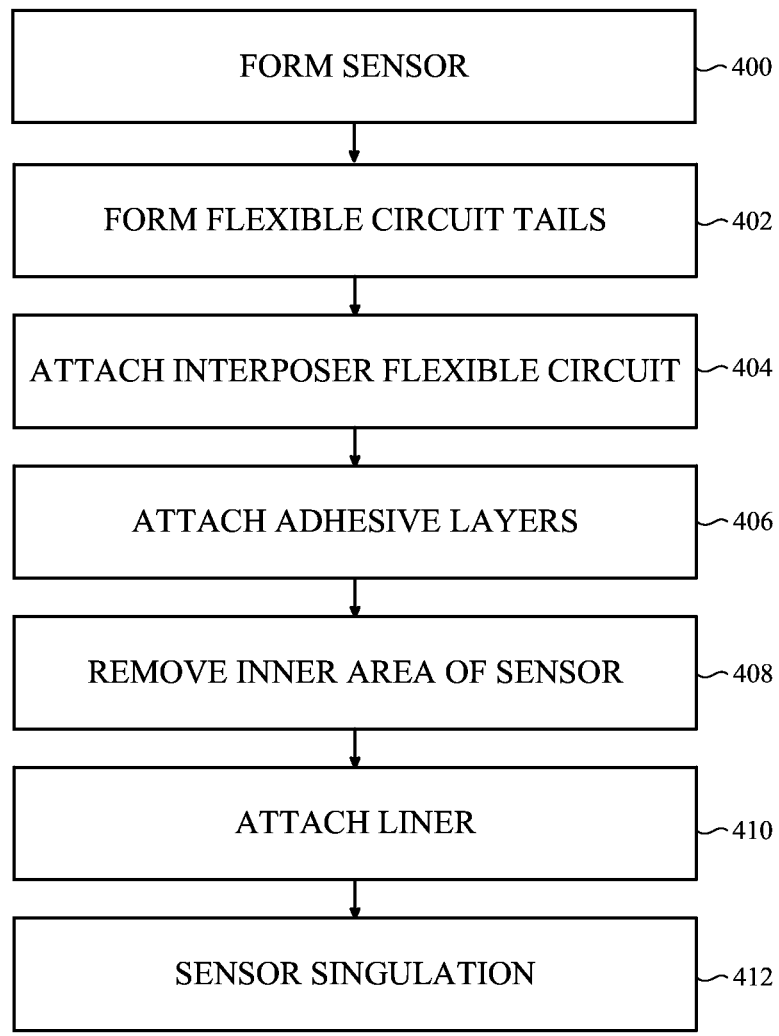
FIG. 4 shows a flowchart of an example method that can be used to produce a sensor module.
Figure 5:
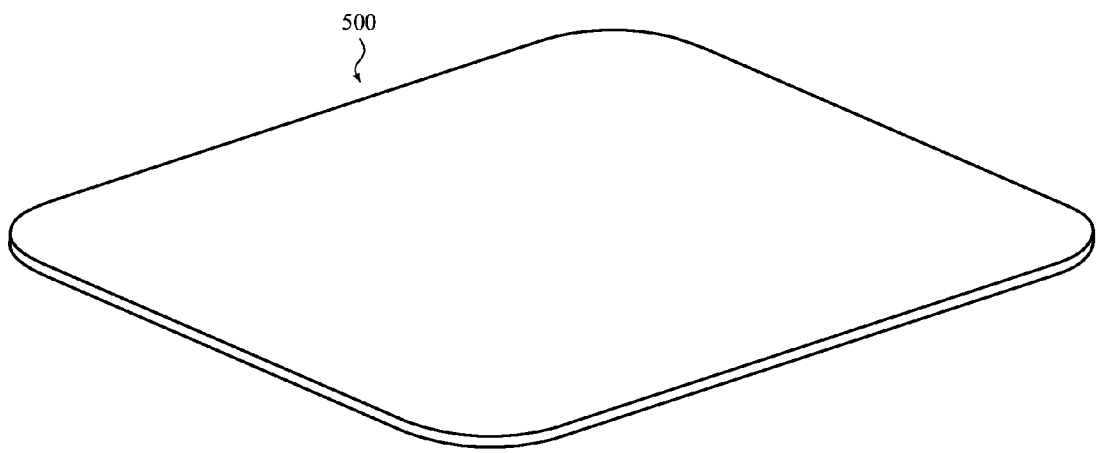
FIG. 5 shows one example of a sheet of a sensor structure.

FIG. 4 shows a flowchart of an example method that can be used to produce a sensor module. Initially, a sensor structure is formed (e.g., sensor 200 in FIG. 2). When formed, the sensor structure is an uninterrupted structure (e.g., a sheet) that includes multiple layers, such as the layers of the force sensor 200 shown in FIG. 2. FIG. 5 illustrates one example of a sheet of a sensor structure. The sheet of the sensor structure 500 will be cut or singulated into individual sensor modules at a later time in the process. Although the sensor structure 500 is shown in a rectangular-like shape, in other embodiments the sensor structure 500 can have any given shape and/or dimensions.

Next, as shown in block 402, the substrate tails are produced by removing the layers above or below each substrate tail. For example, as is described in more detail in conjunction with FIGS. 9B and 9C, a spacer element may be positioned between the substrate tails during an injection molding process to form the compliant layer. The substrate tails are produced when the spacer element is removed. In another embodiment, portions of various layers can be cut out of the sensor structure to produce the first and second substrate tails (see e.g., FIGS. 7B and 7C).

A conductive structure may then be attached to the ends of the substrate tails (block 404). The interposer flexible circuit 310 in FIG. 3 is one example of a conductive structure. As described earlier, the conductive structure operably connects the sensor module to another circuit or component in an electronic device, such as a processing device (not shown). As one example, the first and second substrate tails (e.g., flexible circuit tails) can be connected to an interposer flexible circuit using surface-mount technology.

An adhesive layer can then be formed over a surface of the sensor structure, followed by the removal of portions of the sensor structure and adhesive layer (blocks 406 and 408). Removal of the portions of the sensor structure and the adhesive layer produces openings in each sensor (e.g., opening 302 in FIG. 3). In one example, the adhesive layer can be laminated to the surface of the sensor structure, and the inner area of each sensor can be cut out of the sensor structure. In one embodiment, the adhesive layer can be a pressure sensitive adhesive. The adhesive layer aligns with each sensor in the sensor structure when the adhesive layer is formed over the sensor structure before the inner area of each sensor is removed.

Figure 6:
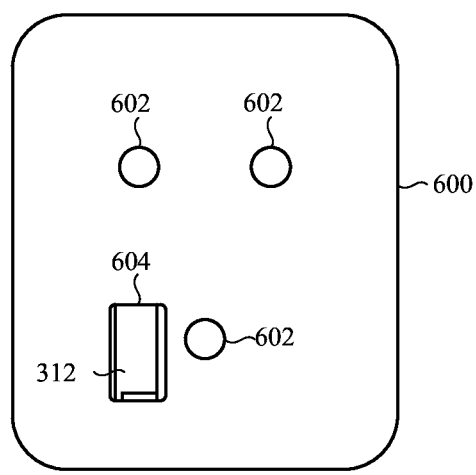
FIG. 6 shows a plan view of a bottom surface of a liner that is attached to a sensor.

Next, as shown in block 410, a liner layer may be attached to the sensor structure. The liner layer includes a liner for each sensor in the sensor structure. A liner can be used to position the sensor and the sensor module in an electronic device. In one embodiment, the liner layer can be laminated to the sensor. FIG. 6 shows a plan view of a top surface of a liner that is attached to a sensor. The sensor is not visible in FIG. 6 because the sensor is below the liner 600. The liner 600 can include one or more optional alignment openings 602 that assist in aligning the sensor properly within the electronic device. For example, in the embodiment shown in FIG. 2, the sensor is positioned on the ledge 202. The one or more optional alignment openings 602 can ensure the sensor is positioned properly on the ledge.

The liner 600 may also include an opening 604 that aligns with the connector 312 in FIG. 3. The opening 604 provides access to the connector 312 to operably connect the sensor to another circuit or component in the electronic device, such as a processing device (not shown).

Returning to block 412 in FIG. 4, the sensor structure is cut or singulated to form discrete sensor modules (e.g., sensor module 300 in FIG. 3). Each discrete sensor module can then be positioned in an electronic device and/or connected to other structural elements or components.

The sensors and the flexible circuit tails (e.g., 306, 308 in FIG. 3) in a sensor structure (e.g., 500 in FIG. 5) can be formed or manufactured using one of a variety of techniques. The methods shown in FIGS. 7-15 are described as including the first and second substrate layers and the patterned compliant layer. However, other embodiments can include additional, fewer, or different layers adjacent to (over or under) a compliant layer.

Figure 7:
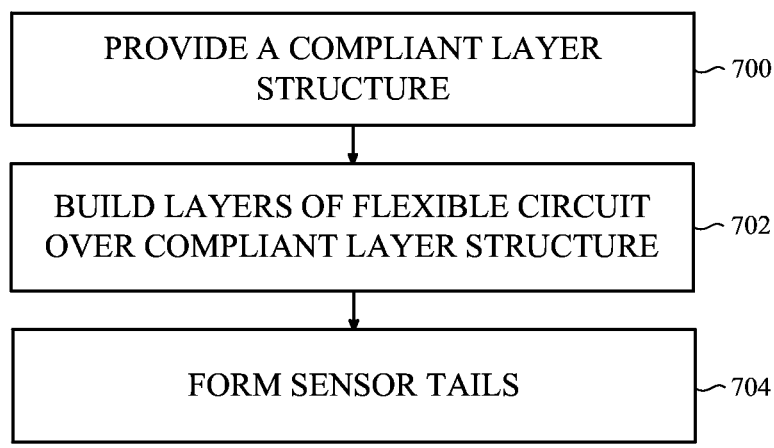
FIG. 7 shows a first method for forming a sensor structure and the flexible circuit tails.
Figure 8A:
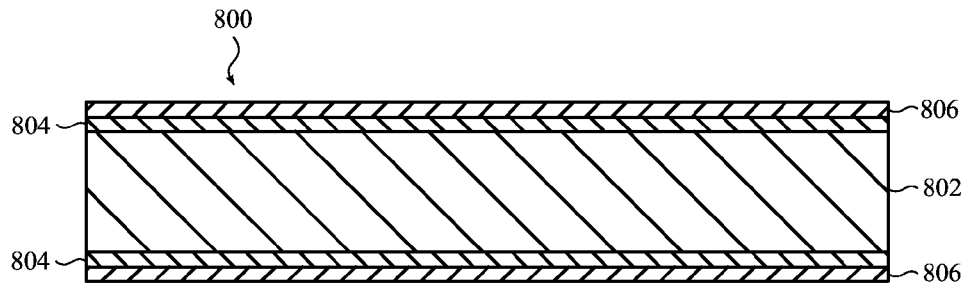
FIGS. 8A-8C illustrate the method shown in FIG. 7.
Figure 8B:
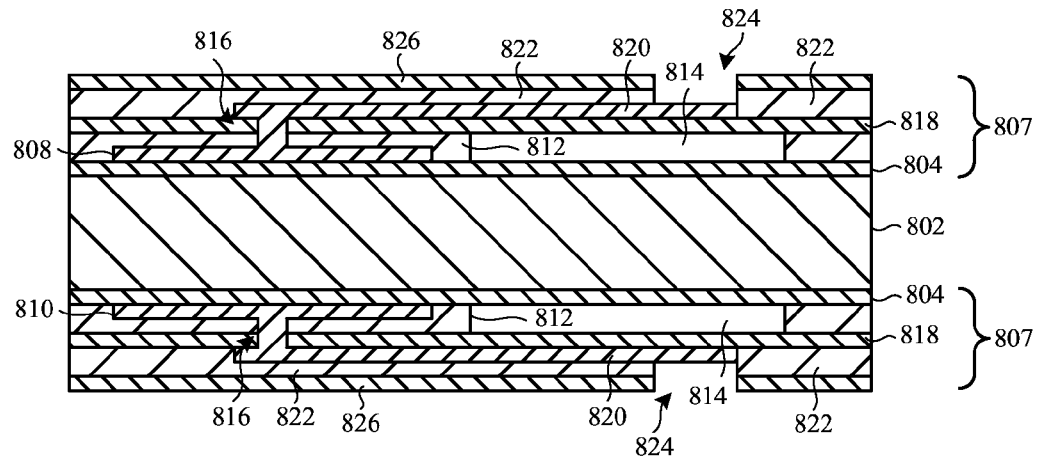
Figure 8C:
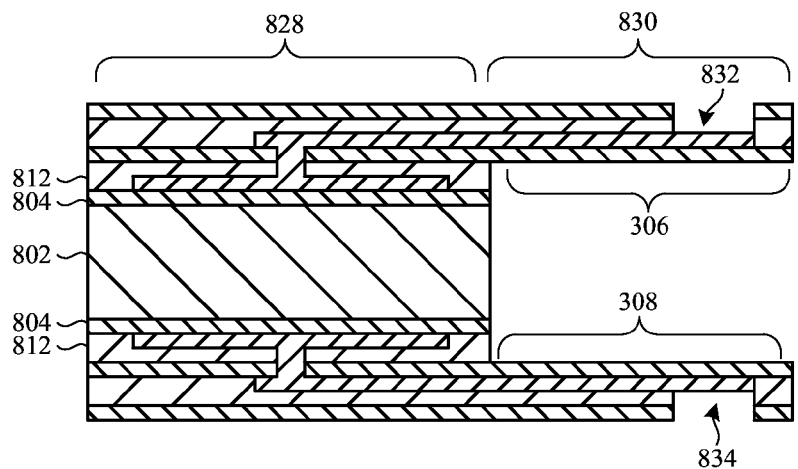

FIG. 7 shows a first method for forming a sensor structure and flexible circuit tails. FIGS. 8A-8C illustrate the method shown in FIG. 7. The process begins at block 700 by providing a compliant structure. The compliant structure 800 can include a compliant layer 802 positioned between two protective layers 804 (see FIG. 8A). A conductive layer 806 is positioned over each protective layer 804. In some embodiments, the compliant structure 800 is formed in a manner similar to a flexible copper clad laminate process. Any suitable material can be used to form the compliant layer 802, the protective layers 804, and the conductive layers 806. In one non-limiting example, the compliant layer 802 is formed with silicone, the protective layers 804 are formed with a polyimide material, and the conductive layers 806 are formed with copper.

Next, as shown in block 702, each layer of the multiple layers that form a substrate 807 are assembled or formed over at least one surface of the compliant structure. The substrate is described as a flexible printed circuit in the embodiments shown in FIGS. 7-15, although other embodiments are not limited to this configuration. In the embodiment illustrated in FIG. 8B, the layers of a flexible printed circuit are formed over two opposing surfaces of the compliant structure using a compressive molding process. Initially, the conductive layers 806 are each patterned to form one or more conductive electrodes 808, 810. As described earlier, each conductive electrode (e.g., 808) in one flexible printed circuit is aligned with a respective conductive electrode (e.g., 810) in the other flexible printed circuit to form a capacitor. When a force is applied to the cover glass 106 (FIG. 2), the compliant layer 802 deforms or compresses and the electrodes 808, 810 move closer together. When the force is reduced or removed from the cover glass 106, the compliant layer 802 uncompresses (e.g., expands) and the electrodes 808, 810 move away from each other. The movement of the electrodes 808, 810 towards and away from each other causes the capacitance of the capacitor to change. These capacitance changes can be correlated to the amount of force applied to the cover glass 106.

Next, an adhesive layer 812 is formed over the compliant structure 800. The adhesive layers 812 cover the electrodes 808, 810 and portions of the protective layers 804. Any suitable adhesive layer may be used. In the embodiment shown in FIG. 8B, the adhesive layers 812 have been patterned to include a first opening 814. A second opening 816 is also formed in the adhesive layers 812 to expose a portion of the electrodes 808, 810. The first and second openings 814, 816 can be formed using any suitable technique.

A second protective layer 818 is then formed over the adhesive layers 812. The second protective layers 818 can be formed with the same material or with a different material as the first protective layers 804. An opening is formed in the second protective layers 818 that aligns with the openings 816 to expose the portion of the electrodes 808, 810. In one embodiment, the first and second openings 814, 816 are formed by cutting the adhesive layers 812 and the second protective layers 818 prior to positioning the layers over the compliant structure 800. In another embodiment, the first and second openings 814, 816 are formed by removing (e.g., cutting) the adhesive and second protective layers 812, 818 after the layers are positioned over the compliant structure 800.

A second conductive layer 820 is then disposed over the second protective layers 818 and extends into the openings 816 to contact the electrodes 808, 810. A third adhesive layer 822 is formed over the second conductive layers 820. The third adhesive layers 822 cover the second conductive layers 820 and portions of the second protective layers 818. An opening 824 is formed in the third adhesive layers 822 to expose a portion of the second conductive layers 820. The exposed portions of the second conductive layers 820 can be used as contacts that electrically connect the flexible printed circuits to other circuits or components, such as the interposer flexible circuit 310 in FIG. 3.

A third protective layer 826 is then formed over the third adhesive layers 822. The third protective layers 826 include an opening that aligns with the opening 824 to expose the portions of the second conductive layers 820. At this point in the process the sensor structure has been formed (e.g., sensor structure 500 in FIG. 5).

Returning to FIG. 7, the flexible circuit tails are then produced at block 704. Portions of the compliant layer 802, the first protective layers 804, and the first adhesive layers 812 are removed to produce the first and second flexible circuit tails 306, 308 (FIG. 8C). As shown in FIG. 8C, the left edges of the openings 814 correspond to the location where the flexible circuit tails 306, 308 begin. In some embodiments, one or more additional processing steps can be performed. For example, the processes associated with blocks 404, 406, 408, 410, and/or 412 may be performed.

The sensor structure and flexible circuit tails include a sensing portion 828 and a signal portion 830. The sensing portion 828 includes the electrodes 808, 810 that form the one or more capacitors. The signal portion 830 includes the first and second flexible circuit tails 306, 308 and contacts 832, 834. In one embodiment, the flexible circuit tail 308 transmits the drive signals to the bottom electrode of each capacitor and the flexible circuit tail 306 transmits the sense signals from the top electrode of each capacitor. A processing device (not shown) can cause the drive signals to be transmitted to the electrode(s) and may receive the sense signals from the electrode(s). The processing device is configured to correlate the sense signals into values representing the amounts of applied force.

Figure 9:
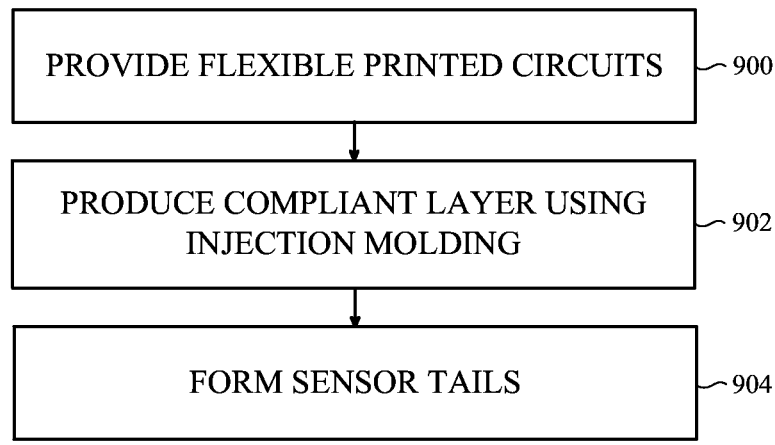
FIG. 9 shows a second method for forming a sensor structure and the flexible circuit tails.
Figure 10A:
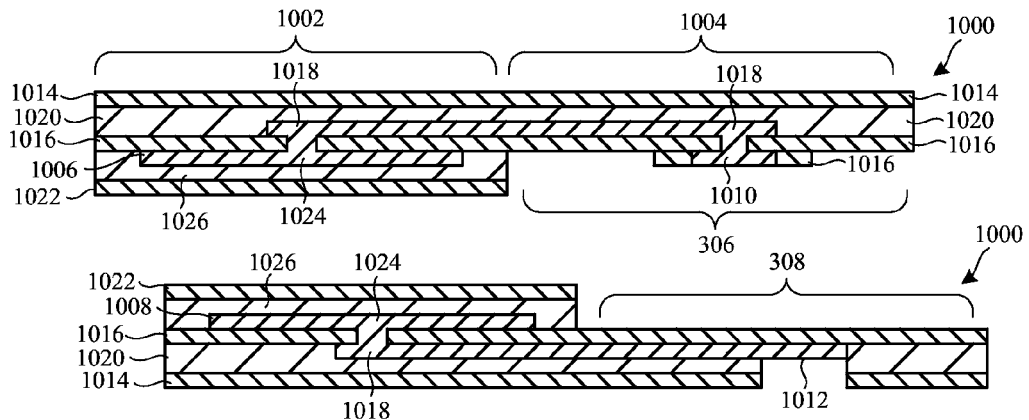
FIGS. 10A-10C illustrate the second method shown in FIG. 9.
Figure 10B:
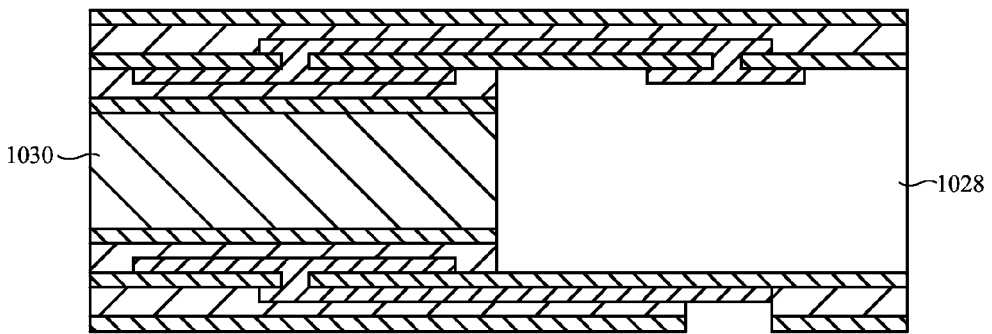
Figure 10C:
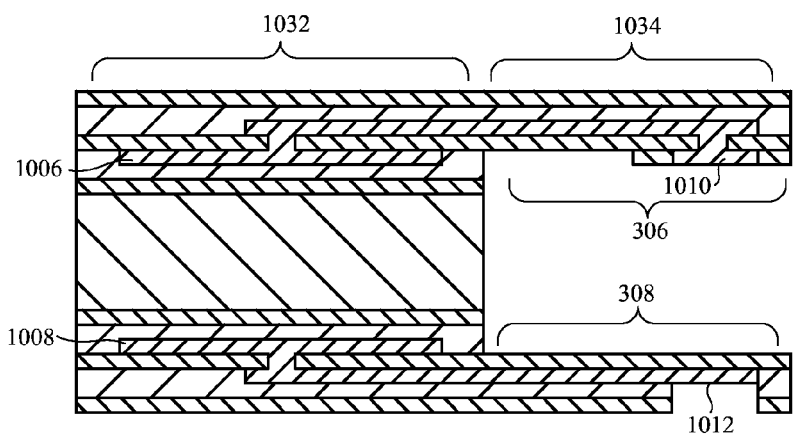

FIG. 9 shows a second method for forming a sensor structure and flexible circuit tails. FIGS. 10A-10C illustrate the method shown in FIG. 9. Initially, as shown in block 900, one or more flexible printed circuits are provided. In the embodiment illustrated in FIG. 10A, two flexible printed circuits 1000 each include a sensing portion 1002 and a signal portion 1004. Like the embodiment shown in FIG.

8C, the sensing portion 1002 includes the electrodes 1006, 1008 that form the one or more capacitors. The signal portion 1004 includes the first and second flexible circuit tails 306, 308 and contacts 1010, 1012.

Each sensing portion 1002 includes a first protective layer 1014, a second protective layer 1016, a first conductive layer 1018 (including contact 1012) and a first adhesive layer 1020 positioned between the first and second protective layers 1014, 1016, a third protective layer 1022, and a second conductive layer 1024 (including the electrodes 1006, 1008 and contact 1010) and a second adhesive layer 1026 positioned between the second and third protective layers 1016, 1022. The first conductive layer 1018 extends into a first opening in the second protective layer 1016 to contact the electrodes 1006, 1008 (e.g., part of second conductive layer 1024). The first adhesive layers 1020 cover the first conductive layer 1018 and portions of the second protective layers 1016. The second adhesive layers 1026 cover the third protective layers 1022.

Each signal portion includes the first protective layer 1014, the second protective layer 1016, the first conductive layer 1018 and the first adhesive layer 1020 positioned between the first and second protective layers 1014, 1016, and the second conductive layer 1024. In the first flexible circuit tail 306, the first conductive layer 1018 extends into a second opening in the second protective layer 1016 to contact the contact 1010 (e.g., part of second conductive layer 1024).

Returning to FIG. 9, a compliant layer is formed between the flexible printed circuit structures 1000 using injection molding (block 902). The flexible printed circuits 1000 are positioned in a mold (not shown) with a spacer element 1028 disposed between the signal portions 1004 (see FIG. 10B). The material that forms the compliant layer 1030 is then injected into the mold and fills the space between the sensing portions 1002 and the spacer element 1028. A sensor structure is then removed from the mold (e.g., sensor structure 500 in FIG. 5).

Next, as shown in block 904, the flexible circuit tails 306, 308 are produced. In the embodiment shown in FIG. 10C, the spacer element 1028 is removed to produce the first and second flexible circuit tails 306, 308. Like the embodiment shown in FIG. 8C, the sensor structure and flexible circuit tails include a sensing portion 1032 and a signal portion 1034. The sensing portion 1032 includes the electrodes 1006, 1008 that form the one or more capacitors. The signal portion 1034 includes the first and second flexible circuit tails 306, 308 and the contacts 1010, 1012. In some embodiments, one or more additional processes can be performed on the sensor structure. For example, the processes associated with blocks 404, 406, 408, 410, and/or 412 may be performed.

Figure 11:
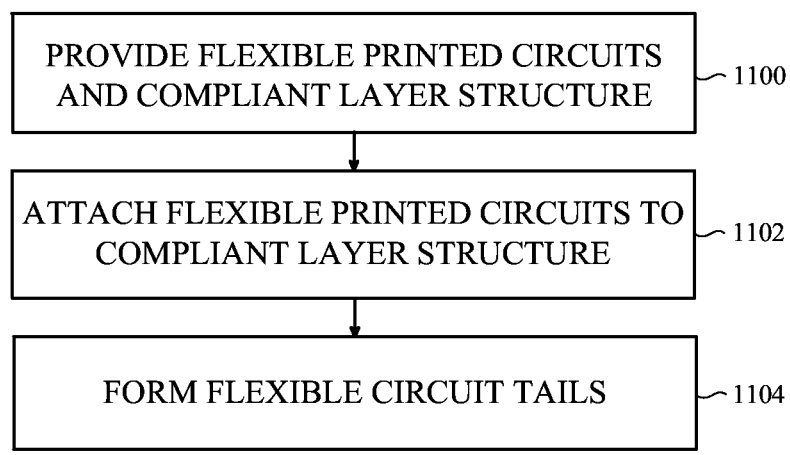
FIG. 11 shows a third method for forming a sensor structure and the flexible circuit tails.
Figure 12A:
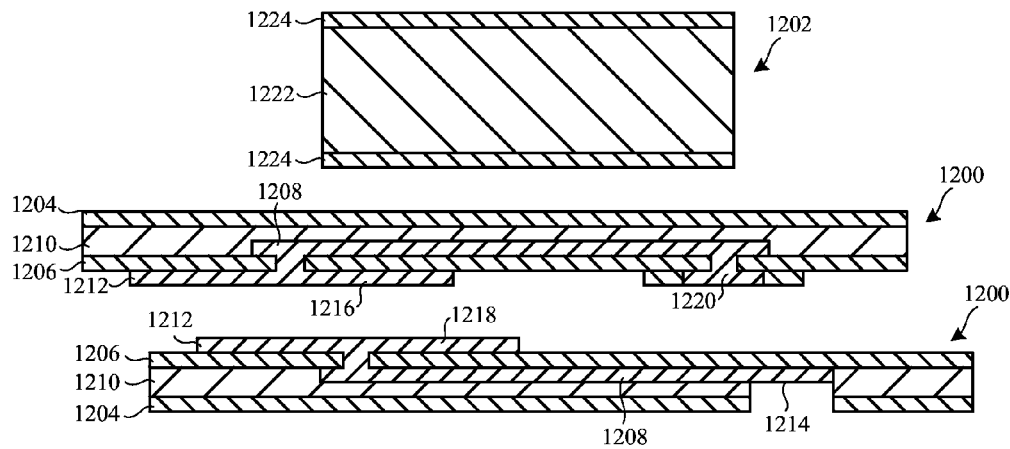
FIGS. 12A-12C illustrate the third method shown in FIG. 11.
Figure 12B:
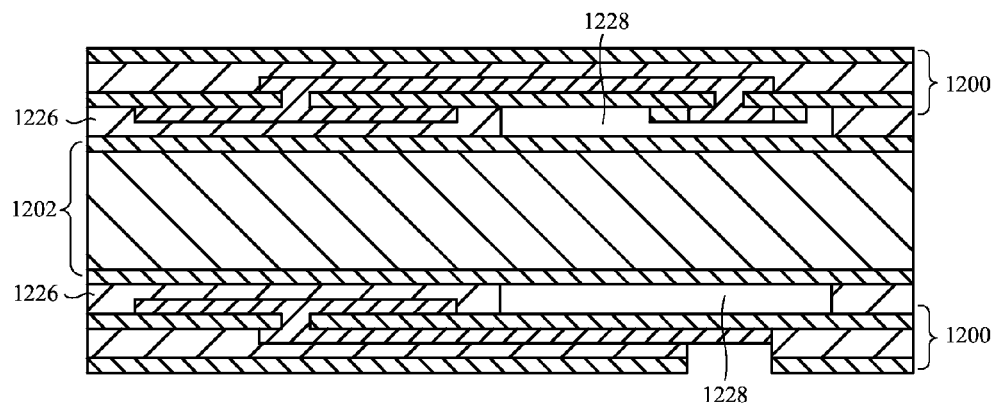
Figure 12C:
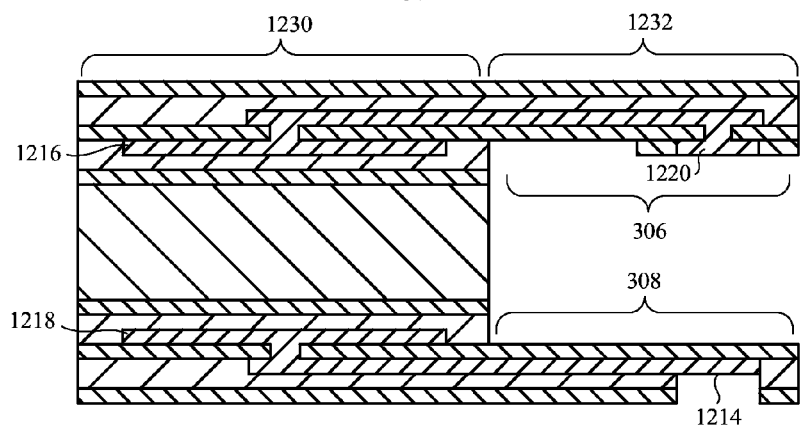

FIG. 11 shows a third method for forming a sensor structure and flexible circuit tails. FIGS. 12A-12C illustrate the method shown in FIG. 11. Initially, as shown in block 1100, one or more flexible printed circuits and a compliant structure are provided. In the embodiment illustrated in FIG. 12A, each flexible printed circuit 1200 includes a first protective layer 1204, a second protective layer 1206, a first conductive layer 1208 and a first adhesive layer 1210 positioned between the first and second protective layers 1204, 1206, and a second conductive layer 1212. The first conductive layer 1208 includes the contact 1214 and the second conductive layers 1212 include the electrodes 1216, 1218 and contact 1220. The first conductive layer 1208 extends into an opening in the second protective layer 1206 to contact the second conductive layer 1212. The first adhesive layers 1210 cover the first conductive layer 1208 and portions of the second protective layers 1206. The electrodes 1216, 1218 and the contact 1220 are exposed in that they are not covered by one or more additional layers.

The compliant structure 1202 includes a compliant layer 1222 positioned between third protective layers 1224. In some embodiments, hairline cuts (as part of a die cutting process) can be formed in the flexible printed circuits 1200 and the compliant structure 1202 to define the locations where portions of the flexible printed circuits 1200 and the compliant structure 1202 will be removed to produce the flexible circuit tails.

Next, as shown in block 1102, the flexible printed circuits are attached to the compliant structure to produce a sensor structure (e.g., sensor structure 500 in FIG. 5). As shown in FIG. 12B, a second adhesive layer 1226 bonds each flexible printed circuit structure 1200 to a surface of the compliant structure 1202. In one embodiment, the flexible printed circuits 1200 can be attached to the compliant structure 1202 using a convention flexible printed circuit bonding adhesive, although other embodiments are not limited to this configuration.

In the illustrated embodiment, the second adhesive layers 1226 are positioned between the electrodes 1216, 1218 and the third protective layers 1224. Openings 1228 are formed in the second adhesive layers 1226. The openings 1228 can be formed in the second adhesive layers 1226 before or after the adhesive layers 1226 are formed over the third protective layers 1224.

Next, as shown in block 1104, the flexible circuit tails are produced. Portions of the compliant layer 1222, the third protective layers 1224, and the second adhesive layers 1226 are removed to produce the first and second flexible circuit tails 306, 308. In some embodiments, one or more additional processing steps can be performed. For example, the processes associated with blocks 404, 406, 408, 410, and/or 412 may be performed.

The sensor structure and flexible circuit tails include a sensing portion 1230 and a signal portion 1232. The sensing portion 1230 includes the electrodes 1216, 1218 that form the one or more capacitors. The signal portion 1232 includes the contacts 1214, 1220 and the first and second flexible circuit tails 306, 308. As shown in FIG. 12C, the left edges of the openings 1228 correspond to the location where the flexible circuit tails 306, 308 extend out from the sensing portion 1230.

Figure 13:
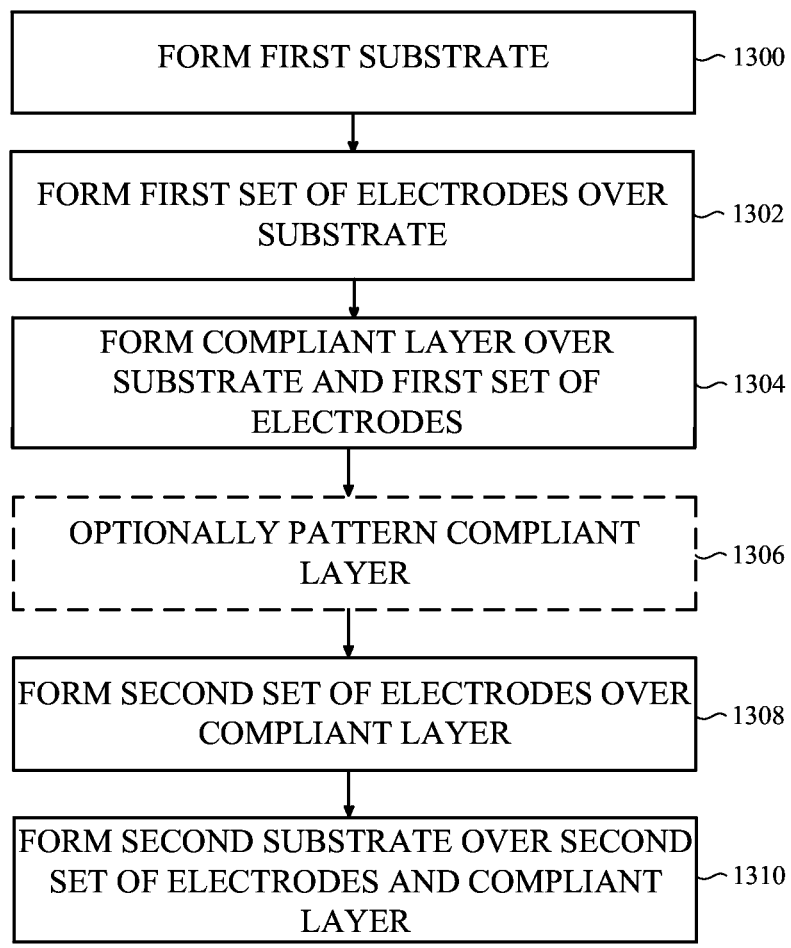
FIG. 13 shows a fourth method for forming a sensor structure.
Figure 14A:
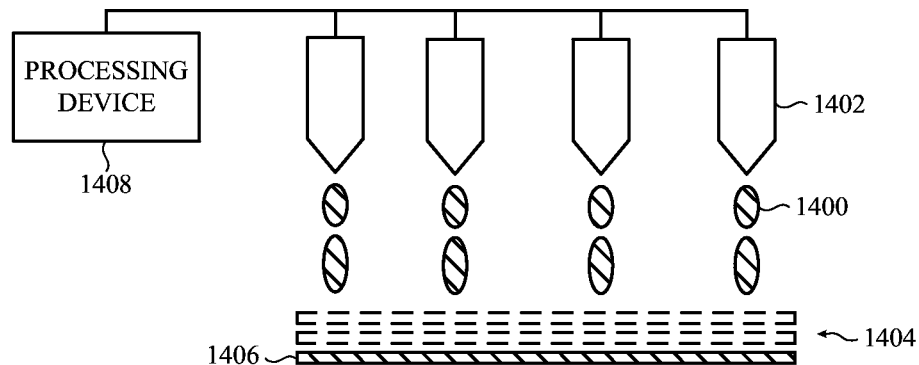
FIGS. 14A-14F illustrate one embodiment of the fourth method shown in FIG. 13.
Figure 14B:
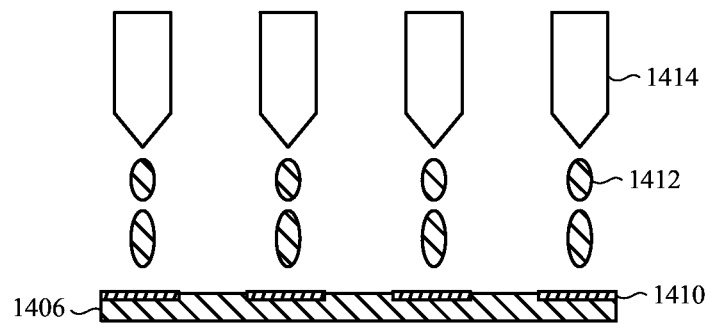
Figure 14C:
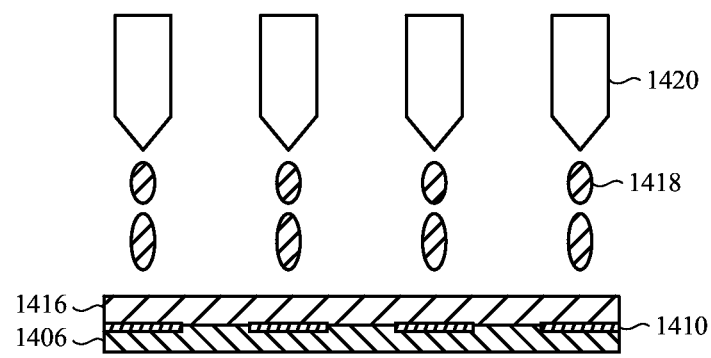
Figure 14D:
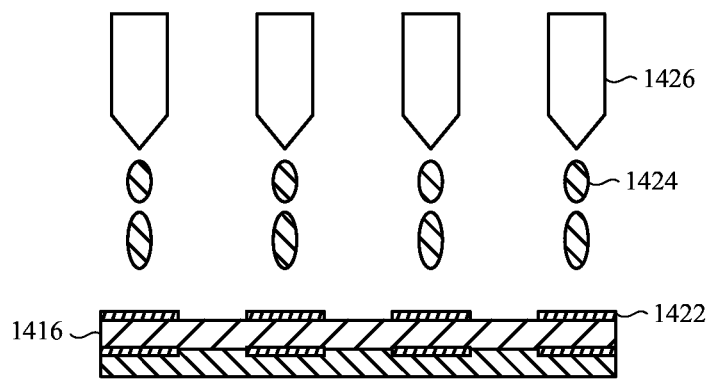
Figure 14E:
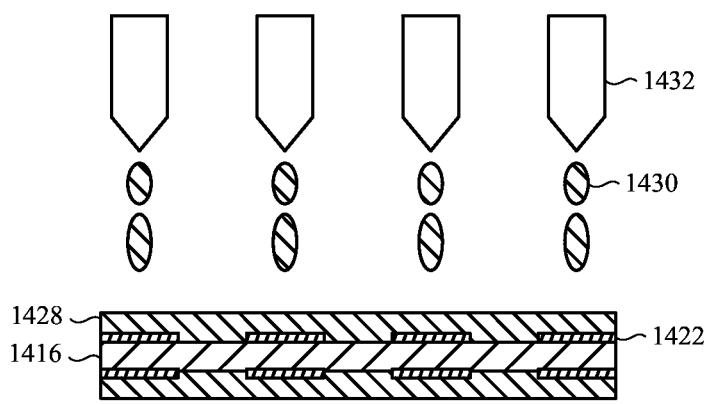

In some embodiments, the sensor can be formed using additive manufacturing or three-dimensional printing techniques. FIG. 13 shows an additive manufacturing method for forming a sensor structure. The method of FIG. 13 is described in conjunction with FIGS. 14 and 15. FIGS. 14A-14F illustrate one embodiment of the fourth method shown in FIG. 13, while FIGS. 15A-15B depict another embodiment of the fourth method shown in FIG. 13.

Initially, as shown in block 1300, a first substrate is formed by melting a substrate material. This process is shown in FIG. 14A. In one embodiment, the melted substrate material 1400 can be jetted from one or more thermal print heads 1402 to form successive layers 1404 of the first substrate 1406. The substrate material can be any suitable material, such as, for example, a polymer (e.g., a polyimide), a thermoplastic polyester (e.g., a polyethylene terephthalate), and a thermoplastic polymer (e.g., a polypropylene). The rate of output of the substrate material 1400 (as well as the other materials in FIGS. 14B-14E) from the one or more print heads 1402 may be controlled by a processing device 1408.

Next, as shown in block 1302, a first set of conductive electrodes is formed over the substrate. The first set of conductive electrodes 1410 can include one or more electrodes (see FIG. 14B). The first set of electrodes 1410 can be formed by jetting a melted conductive material 1412 from one or more thermal print heads 1414. Any suitable conductive material may be used. For example, in one embodiment the conductive material can be a metal such as copper or indium tin oxide. In other embodiments, the conductive material may be conductive or conductive-coated nanoparticles that are included in an insulating material.

A compliant layer is then formed over the substrate and the first set of electrodes (block 1304). This process is shown in FIG. 14C. The compliant layer 1416 can be formed by jetting a melted compliant material 1418 from one or more thermal print heads 1420. Any suitable compliant material may be used. For example, in one embodiment the compliant material can be silicone.

In some embodiments, the compliant material may be an ultra-violet (UV) curable compliant material. In such embodiments, the compliant layer 1416 can be patterned at block 1306. FIG. 15A illustrates a patterned compliant layer 1500. In the illustrated embodiment, the compliant layer is patterned to have areas that include the compliant material and areas that do not include the compliant material. In some embodiments, the patterned compliant layer 1500 can provide the sensor with a higher degree of compressibility. The compliant material that forms the patterned compliant layer can squeeze into the areas that do not include the compliant material when a force is applied to the sensor.

The pattern in the UV curable compliant material can be formed using any suitable technique. For example, in one embodiment a mask having openings that define the pattern can be positioned over the compliant material. An ultraviolet light may be directed toward the mask, where the openings allow portions of the ultraviolet light to impinge on the compliant material and create a photo-chemical reaction that sets or hardens portions of the liquid or semi-liquid compliant material. In another embodiment, the pattern can be formed using a nanoimprint lithography process. A processing device (e.g., processing device 1408) can control the process of forming the pattern in the compliant layer.

Next, as shown in block 1308, a second set of conductive electrodes is formed over the compliant layer. In some embodiments, the compliant layer is patterned as shown in FIG. 15A. The second set of conductive electrodes 1422 can include one or more electrodes (see FIG. 14D). The second set of electrodes 1422 can be formed by jetting a melted conductive material 1424 from one or more thermal print heads 1426. Any suitable conductive material may be used, and the conductive material in the second set of electrodes can be the same material or a different material from the material in the first set of electrodes 1410.

A second substrate may then be formed over the second set of electrodes and the compliant layer (block 1310). This process is shown in FIG. 14E. Melted substrate material 1430 can be jetted from one or more thermal print heads 1432 to form the second substrate 1428. Like the first substrate 1406, the second substrate 1428 can be formed with any suitable material or combination of materials, such as, for example, a polymer, a thermoplastic polyester, and a thermoplastic polymer.

Figure 14F:
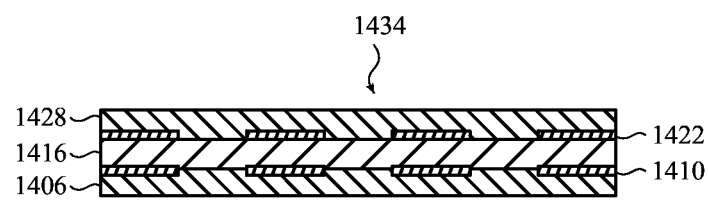
Figure 15A:
FIGS. 15A-15B depict another embodiment of the fourth method shown in FIG. 13.
Figure 15B:
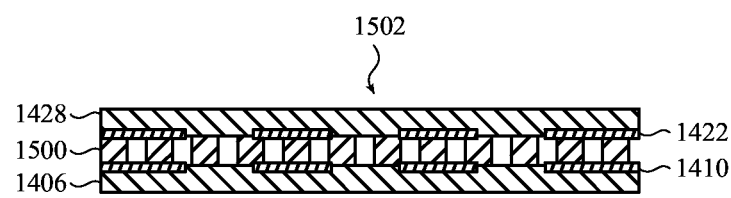

A completed sensor structure 1434, 1502 is shown in FIG. 14F and FIG. 15B, respectively. One or more of the processes associated with blocks 404, 406, 408, 410, and/or 412 may be performed with the sensor structure 1434, 1502.

The conductive layers and the protective layers can be formed using a variety of techniques. As one example, the conductive layers and/or the protective layers may be formed using conventional methods used to fabricate flexible printed circuits. Alternatively, in some embodiments, the conductive layers and/or the protective layers may be formed by deposition, coating and patterning techniques. In other embodiments, the conductive layers and/or the protective layers may be formed by screen-printing the layer or layers. And in some embodiments, the conductive layers and/or the protective layers may be formed by stamping, embossing, and thermal compression methods.

Additionally or alternatively, an interconnection between the first and second conductive layers may be formed using one of a variety of techniques. For example, the interconnection can be formed using a through via that is filled with a conductive material (e.g., copper). Alternatively, the interconnection may be implemented with conductive dot dispensing. In this technique, conductive particles make an electrical connection between the first and second conductive layers. In another embodiment, the interconnection can be formed with a conductive nanowire coating or through wire bonding.

Additionally or alternatively, the connection between a substrate tail (e.g., flexible printed circuit tails 306, 308 in FIG. 3) and the conductive structure (e.g., interposer flexible circuit 310 in FIG. 3) can be implemented in a variety of ways. For example, the connection can be formed with surface mount technology. Alternatively, in some embodiments the connection may be formed through metal thermos-compression bonding. Like the interconnection between the first and second conductive layers, the connection between the substrate tail and the conductive structure can be implemented with conductive dot dispensing, conductive nanowire coating, or wire bonding.

The foregoing description, for purposes of explanation, used specific nomenclature to provide a thorough understanding of the described embodiments. However, it will be apparent to one skilled in the art that the specific details are not required in order to practice the described embodiments. Thus, the foregoing descriptions of the specific embodiments described herein are presented for purposes of illustration and description. They are not targeted to be exhaustive or to limit the embodiments to the precise forms disclosed. It will be apparent to one of ordinary skill in the art that many modifications and variations are possible in view of the above teachings.

What is claimed is:

1. A method for forming a sensor module, comprising:
providing a compliant structure that includes a compliant layer between a first protective layer and a second protective layer;
forming a first conductive layer on the first protective layer and forming a second conductive layer on the second protective layer;
patterning the first conductive layer to form a first conductive electrode and patterning the second conductive layer to form a second conductive electrode aligned with the first conductive electrode, the first conductive electrode and the second conductive electrode forming a capacitor;
forming a first adhesive layer that covers the first conductive electrode and a portion of the first protective layer;
patterning the first adhesive layer to form a first opening and a second opening in the first adhesive layer;

forming a first substrate layer on the first adhesive layer, wherein the first substrate layer includes a first third conductive layer, and the third conductive layer electrically connects to the first conductive layer through the first opening; and producing a first flexible substrate tail from a portion of the first substrate layer, the first flexible substrate tail produced by removing a multi-layer portion of the compliant structure and a portion of the first conductive layer that are aligned with and to one side of the second opening.

2. The method of claim 1, further comprising:

forming a second adhesive layer that covers the second conductive electrode and a portion of the second protective layer;

patterning the second adhesive layer to form a third opening and a fourth opening in the second adhesive layer;

forming a second substrate layer on the second adhesive layer, wherein the second substrate layer includes a fourth conductive layer, and the fourth conductive layer electrically connects to the second conductive layer through the third opening; and producing a second flexible substrate tail from a portion of the second substrate layer, the second flexible substrate tail produced while removing the multi-layer portion of the compliant structure and a portion of the second conductive layer.

3. The method of claim 2, wherein producing the first and second flexible substrate tails from the portions of the first and second substrate layers further comprises:

removing a portion of the first substrate layer and the second substrate layer.

4. The method of claim 2, wherein the first substrate layer comprises a first flexible printed circuit, the second substrate layer comprises a second flexible printed circuit, and the compliant layer comprises a silicone layer.

5. The method of claim 4, wherein the first conductive layer and the second conductive layer are each patterned to form a plurality of conductive electrodes, wherein each conductive electrode in the first conductive layer is aligned with a respective conductive electrode in the second conductive layer to form a plurality of capacitors.

6. The method of claim 2, wherein:

forming the first substrate layer comprises forming a third protective layer over the first adhesive layer, the third protective layer having a fifth opening aligned with the first opening and the first conductive electrode;

forming the second substrate layer comprises forming a fourth protective layer over the second adhesive layer, the fourth protective layer having a sixth opening aligned with the third opening and the second conductive electrode;

wherein the third conductive layer extends through the first opening and the fifth opening and contacts the first conductive electrode, and the fourth conductive layer extends through the third opening and the sixth opening and contacts the second conductive electrode.

7. The method of claim 2, wherein producing the first flexible substrate tail and the second flexible substrate tail comprises:

removing portions of the compliant layer, the first conductive layer, the second conductive layer, the first adhesive layer, and the second adhesive layer.

8. The method of claim 2, wherein the first substrate layer is formed on the first adhesive layer and the second substrate layer is formed on the second adhesive layer using a compressive molding process.

9. The method of claim 2, further comprising:

attaching an interposer flexible circuit to the first flexible substrate tail and the second flexible substrate tail.

10. The method of claim 1, wherein forming the first substrate layer on the first adhesive layer comprises:

forming a first layer in the first substrate layer on the first adhesive layer; and forming a second layer in the first substrate layer on the first layer.

11. The method of claim 1, wherein removing the portion of the compliant structure comprises:

removing portions of the compliant layer, the first protective layer, and the first conductive layer.

* * * * *

UNITED STATES PATENT AND TRADEMARK OFFICE
CERTIFICATE OF CORRECTION

PATENT NO. : 10,101,857 B2  
APPLICATION NO. : 14/838959  
DATED : October 16, 2018  
INVENTOR(S) : Po-Jui Chen et al.

Page 1 of 1

It is certified that error appears in the above-identified patent and that said Letters Patent is hereby corrected as shown below:

In the Claims

Column 12, Lines 50-67 and Column 13, Lines 1-11, should read:
1. A method for forming a sensor module, comprising: providing a compliant structure that includes a compliant layer between a first protective layer and a second protective layer; forming a first conductive layer on the first protective layer and forming a second conductive layer on the second protective layer; patterning the first conductive layer to form a first conductive electrode and patterning the second conductive layer to form a second conductive electrode aligned with the first conductive electrode, the first conductive electrode and the second conductive electrode forming a capacitor; forming a first adhesive layer that covers the first conductive electrode and a portion of the first protective layer; patterning the first adhesive layer to form a first opening and a second opening in the first adhesive layer; forming a first substrate layer on the first adhesive layer, wherein the first substrate layer includes a "first" third conductive layer, and the third conductive layer electrically connects to the first conductive layer through the first opening; and producing a first flexible substrate tail from a portion of the first substrate layer, the first flexible substrate tail produced by removing a multi-layer portion of the compliant structure and a portion of the first conductive layer that are aligned with and to one side of the second opening.

Signed and Sealed this  
Twenty-seventh Day of August, 2019

Andrei Iancu  
*Director of the United States Patent and Trademark Office*